(12) United States Patent
Thiesfeld et al.

(10) Patent No.: US 8,601,358 B2
(45) Date of Patent: Dec. 3, 2013

(54) BUFFER TRANSFER CHECK ON VARIABLE LENGTH DATA

(75) Inventors: Charles W. Thiesfeld, Lakeville, MN (US); Sami Iren, Mars, PA (US)

(73) Assignee: Seagate Technology LLC, Cupertino, CA (US)

( * ) Notice: Subject to any disclaimer, the term of this patent is extended or adjusted under 35 U.S.C. 154(b) by 397 days.

(21) Appl. No.: 12/617,284

(22) Filed: Nov. 12, 2009

(65) Prior Publication Data

US 2011/0113313 A1 May 12, 2011

(51) Int. Cl.
*G06F 11/00* (2006.01)

(52) U.S. Cl.
USPC .......................... 714/799; 714/763; 714/807

(58) Field of Classification Search
USPC .......................................... 714/799, 763, 807
See application file for complete search history.

(56) References Cited

U.S. PATENT DOCUMENTS

| | | | |
|---|---|---|---|
| 6,711,659 B2 | 3/2004 | Miller et al. | |
| 7,234,101 B1 * | 6/2007 | Konda et al. | 714/798 |
| 7,457,822 B1 * | 11/2008 | Barrall et al. | 1/1 |
| 7,941,727 B2 * | 5/2011 | Greenlaw | 714/758 |
| 2003/0093633 A1 | 5/2003 | Thiesfeld et al. | |
| 2003/0177435 A1 * | 9/2003 | Budd et al. | 714/776 |
| 2008/0172594 A1 * | 7/2008 | Unruh | 714/799 |
| 2009/0259924 A1 * | 10/2009 | Amann et al. | 714/807 |

* cited by examiner

*Primary Examiner* — Philip Guyton
(74) *Attorney, Agent, or Firm* — Alan G. Rego; Westman, Champlin & Koehler, P.A.

(57) ABSTRACT

The disclosure is related to systems and methods for checking the integrity of a data transfer to or from a buffer or other data storage medium. Check values can be added to a data object in a data object based file system. From the check values, a device receiving the data object may determine an integrity or validity of the received data object based on the check values. In a particular embodiment, a hash value may be determined based on the check values. The hash value may be stored in the metadata of the transferred data object. The receiving device may re-calculate the hash value from the check values and compare it to the stored hash value to determine an integrity of the received data object.

21 Claims, 5 Drawing Sheets

BUFFER TRANSFER CHECK ON VARIABLE LENGTH DATA

BACKGROUND

Computers and data storage devices routinely transfer data to or from data buffers. However, errors may occur during the transfers. A means to check the integrity of a data transfer to or from a buffer is needed.

DETAILED DESCRIPTION

In the following detailed description of the embodiments, reference is made to the accompanying drawings which form a part hereof, and in which are shown by way of illustration of specific embodiments. It is to be understood that other embodiments may be utilized and structural changes may be made without departing from the scope of the present disclosure.

Figure 1:
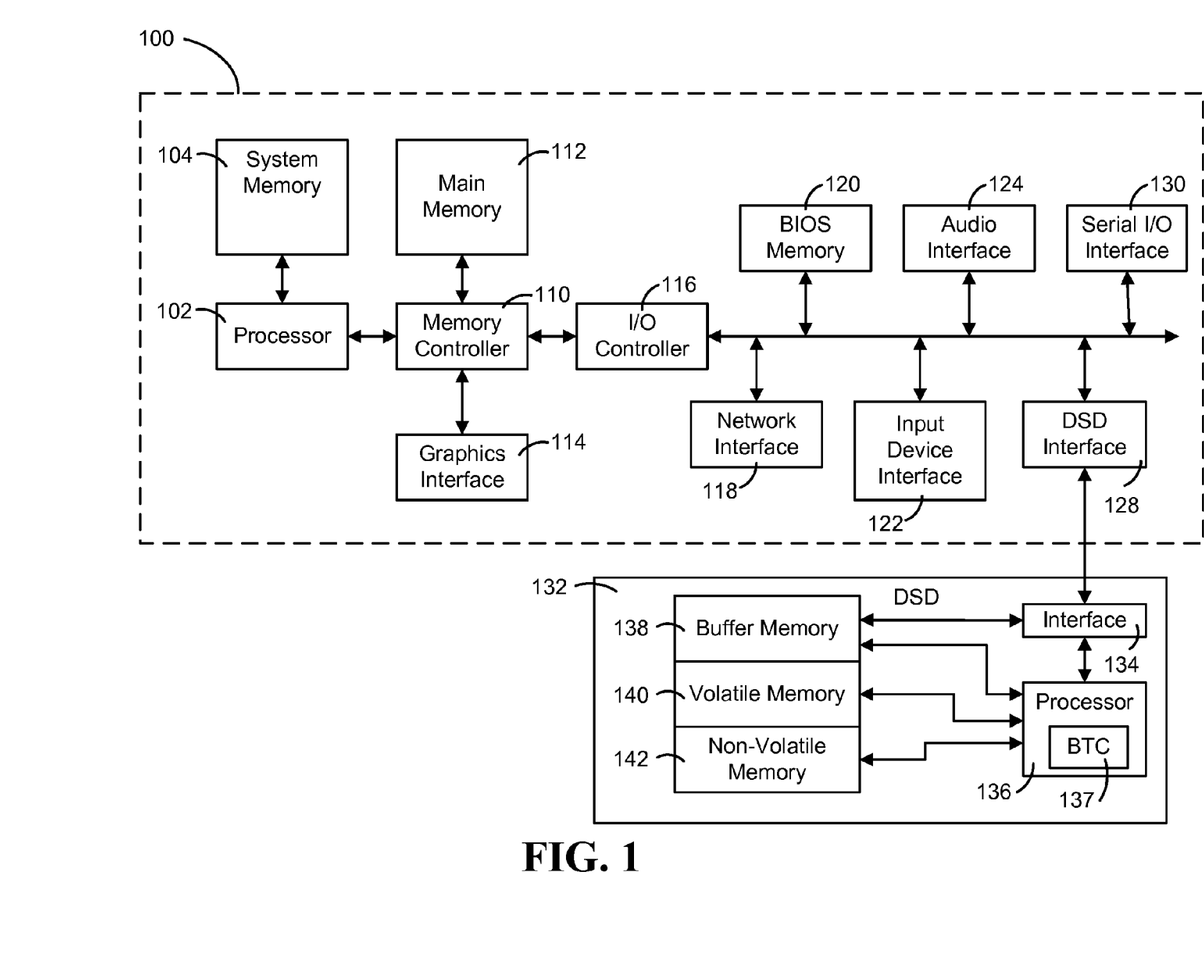
FIG. 1 is a diagram of an illustrative embodiment of a computer system including a data storage device having a buffer transfer check system.

Referring to FIG. 1, a particular embodiment of a computer system is shown and generally designated 100. The computer system 100 can be a desktop computer, a laptop computer, a server, a personal digital assistant (PDA), a telephone, a music player, another electronic device, or any combination thereof. The computer system 100 may also be referred to as a host or host computer. The host 100 may include a central processing unit (CPU) 102 that may be a processor, controller, digital signal processor, reduced instruction set computer (RISC), application specific integrated circuit (ASIC), and the like. Although shown with one CPU 102, the computer system 100 may alternatively include multiple processing units. The CPU 102 may be connected to a system memory 104 that may be a random access volatile memory, such as synchronous dynamic random access memory (SDRAM). System memory 104 may optionally be any type of high speed memory device or memory circuitry.

The CPU 102 may also be coupled to a memory controller 110 that can be coupled to a main memory 112 and a graphics interface 114. The memory controller 110 can provide an interface to allow the CPU 102 or other devices to access the main memory 112. The main memory 112 may be volatile random access memory (RAM) and can be composed of one or more memory modules. The memory controller 110 can include logic for mapping addresses to and from the CPU 102 and other devices to particular areas of the main memory 112. The graphics interface 114 may include a video controller (not shown) and video memory (not shown) that may be connected to a display. The memory controller 110 can handle communications between the CPU 102, the main memory 112, the graphics interface 114, and an input/output (I/O) controller 116 that is coupled to the memory controller 110.

The I/O controller 116 can provide an interface for the CPU 102 to access other devices, such as a network interface 118, a basic input output system (BIOS) memory 120, various input devices such as a keyboard or mouse via an input device interface 122, an audio speaker or microphone via an audio interface 124, a data storage device 132 via a data storage device interface 128, and serial I/O devices via a serial I/O interface 130. The BIOS memory 120 may be flash memory or read-only-memory (ROM) and can contain the firmware code to initialize the BIOS and the hardware of the computer system 100 and load an operating system to the system memory 104. In a particular embodiment, the data storage device interface 128 may be an object based storage device interface that allows communication from the host to an object based data storage device.

In a particular embodiment, the data storage device 132 can be an object based data storage device and can include an object based data storage interface 134 and a processor 136. The object based data storage interface 134 can receive a data object that can comprise user data, metadata, and data identifying an attribute of the data object. In some embodiments, the data identifying one or more attributes of the data object may be part of the metadata. When a data object is received by the object based data storage interface 134, the data storage device 132 may assign a unique identifier to the data object and transmit the unique identifier to the host 100 via the object based data storage interface 134.

The object based data storage interface 134 may be coupled to a buffer memory 138 that may store data as it is received from the host 100. The data storage device 132 may also include a volatile memory 140 and a non-volatile memory 142. The non-volatile memory may include magnetic storage, solid state storage, optical storage, or any combination thereof. Thus, the data storage device 132 may be any type of data storage device, including a solid state storage device, a disc drive storage device, or a hybrid data storage device having more than one type of non-volatile memory.

The data storage device 132 may also include a buffer transfer check (BTC) module 137. The BTC module 137 may include software instructions stored in memory that can be executed by the processor 136 to perform a validity check on data that has been transferred to the buffer 138. Also, the BTC module 137 may comprise hardware logic to perform the validity check.

During operation, the BTC module 137 may execute a method of verifying data transferred between the host 100 and the buffer 138. The method of verifying data may also be used to verify data transferred between the non-volatile memory 142 or the volatile memory 140 and the buffer memory 138.

The host 100 may calculate a first error detection value based on the data object and produce a modified data object by inserting check values based on the error detection value into the data object. Two or more check values may be added to the data object, with at least one check value being added to the data object at an end of the data object. The check values, collectively, comprise information to allow a system to determine the first error detection value that can indicate if there are errors in the data object. This may be done by the host 100, such as at the I/O controller 116, or may be done by the data storage device 132 after a data object is received at the object based data storage interface 134. The interval chosen to insert the check values may be determined by a controller based on storage efficiencies and check algorithm confidence levels. For example, the check values may be inserted after each data segment, having a specific a number of bytes, starting from the beginning of the data object. Also, a check value can be added to the end of the data object, irrespective of the number of bytes in the last data segment.

The error detection values may be generated using any known algorithm, including cyclic redundancy check (CRC), a check sum, or a hash value. The error detection values, and therefore the check values, may be generated based on an object related value, such as the user data, the metadata, or an attribute of the data object. For example, the error detection value may be based on the unique object identifier for the data object. In another example, the error detection value may be based on an attribute of the data object, such as an object creation time.

When the modified data object is generated by the host 100, the modified data object may be transferred to the data storage device 132 via the data storage interface 128 and the interface 134. The data storage device 138 may then store the data object in the buffer memory 138.

The buffer transfer check module 137 may retrieve the check values from the modified data object and generate a second error detection value using the retrieved check values. Then, the buffer transfer check module 137 may compare the second error detection value to an expected error detection value to determine validity of the modified data object. The expected error detection value may be determined by recalculating the first error detection value from the data object or by retrieving the first error detection value if it was stored in the metadata of the data object. In another particular embodiment, retrieved check values may be individually compared to newly generated check values.

If the modified data object is determined to be valid, the modified data object, including the check values, may be stored in the non-volatile memory 142. The modified data object may be stored using compression, encryption, or both. If used, the compression and encryption algorithms may compress and encrypt, respectively, the check values as part of the modified data object. If the modified data object is determined not to be valid, a notice can be sent to the host 100 to indicate an error in the data transfer. The host 100 may then retransmit the modified data object.

When a modified data object is stored at the non-volatile memory 142 and a read command is received from the host 100, the data storage device 132 may check the integrity of the modified data object prior to sending the modified data object to the host 100. For example, the BTC module 137 may retrieve the modified data object from the non-volatile memory and retrieve the check values from the modified data object. The BTC module 137 may then determine a first error indicator value, such as a hash value, from the check values and compare the first error indicator value to a second error indicator value, such as an error indicator value stored in the metadata of the modified data object or stored elsewhere within the data storage device 132. An integrity or validity of the modified data object may be determined from the comparison. If the integrity does not surpass a certain threshold, such as an error correction capability, the data storage device 132 may implement one or more data recovery techniques to retrieve the data from the non-volatile memory 142. When the integrity does not surpass the threshold, the data storage device 132 may also alert the host 100 of the errors. When the integrity does surpass the threshold, the data storage device 132 may transfer the modified data object to the host 100.

Figure 2:
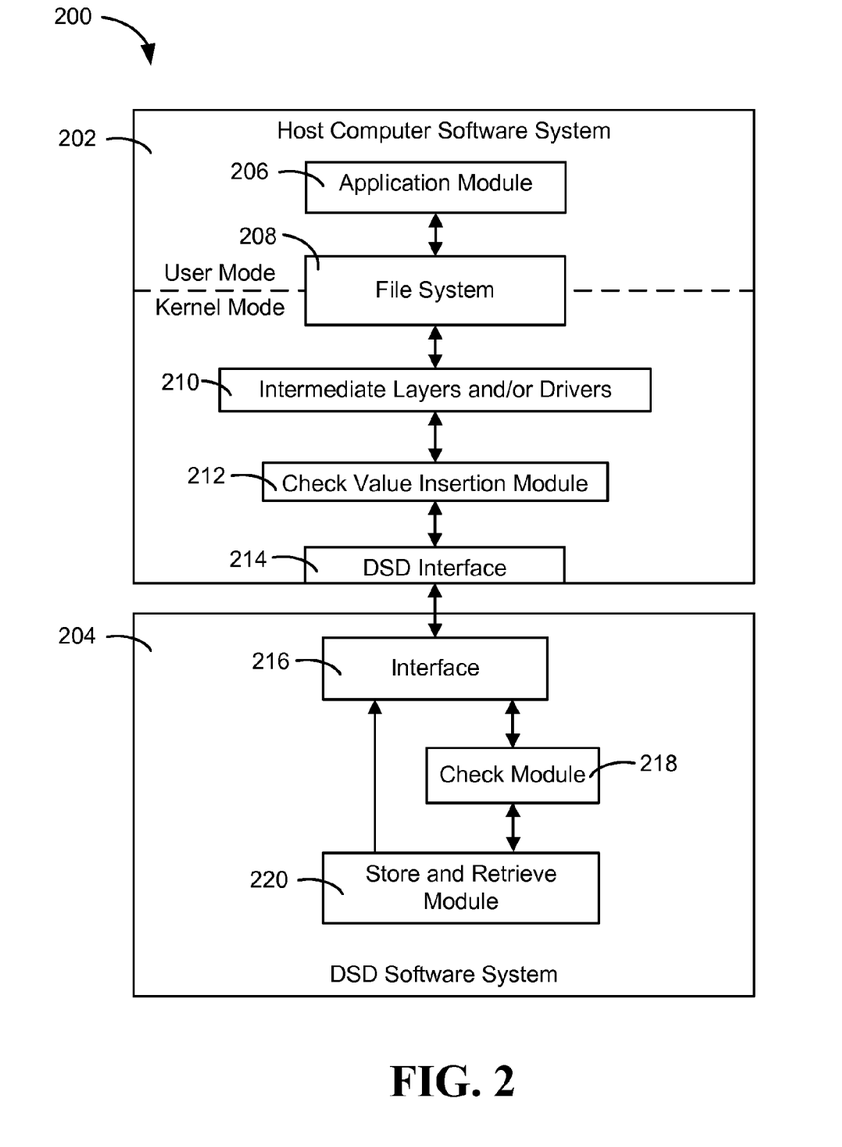
FIG. 2 is a diagram of another illustrative embodiment of a computer system including a data storage device having a buffer transfer check system.

FIG. 2 is an illustrative embodiment of a computer system including a data storage device having a buffer transfer check system. FIG. 2 also illustrates a suitable software environment 200 of functional software components in which a buffer transfer check system may be implemented. The software environment 200 may comprises a host computer software system 202 and a data storage device software system 204. The host computer software system 202 may be associated with a host computer such as host 100 shown and described above in conjunction with FIG. 1. Additionally, the data storage device software system 204 may be associated with a data storage device such as data storage device 132 also shown and described above in conjunction with FIG. 1.

The data storage device software system 204 can include an interface module 216 that receives data from the host and passes it onto a data object integrity check module 218. The data object integrity check module 218 can evaluate and validate the data object received from the interface module 216. The data object integrity check module 218 can also communicate the data object, when verified, to a store/retrieve module 220, which can store the verified data object to a data storage medium, such as the non-volatile memory 142 shown in FIG. 1. Additionally, the store/retrieve module 220 can retrieve the data object from the storage medium and transmit the data object to the data object integrity check module 218 to validate the data object prior to sending the data object to the host computer software system 202. Alternatively, the store/retrieve module 220 can retrieve the data object from the storage medium and transmit the data object to the interface 216 for transfer to the host without providing the data object to the data object integrity check module 218. The data storage device software system 204 can transmit and receive data objects from the host computer software system 202 through the interface module 216 when it is coupled to interface module 214.

The host computer software system 202 can include an operating system that manages many of the overall functions of the hardware and software for the host computer software system 202. The operating system may be the system upon which other modules run, such as the drivers and intermediate layers of processing 210 as well as other applications, such as application module 206. The operating system can also have a file system 208 that may operate in either a user mode or a kernel mode. The application module 206 may communicate with the file system 208 in the user mode. The drivers 210 may be used to provide communication between the kernel mode of the file system 208 and interface 214.

In general, the file system 208 can provide the overall structure in which files are named, stored and organized. The file system 208 comprises files, directories, and the information needed to locate and access these items. In addition, the file system 208 can manage the files and related information as data objects that include user data corresponding to a file, metadata, and data comprising an attribute of the file. Such data objects may be stored to an object based data storage medium and identified using a unique object identifier. The unique object identifier allows the file system 208 to retrieve and manage a data object. In a particular embodiment, check value insertion module 212 may insert check values into the data object prior to sending the data object to a storage device. The check values can contain information to allow a data storage device to verify the integrity or validity of a data transfer. In another embodiment, the file system may not manage the metadata and instead the metadata may be managed by a processor, such as processor 136.

In a particular embodiment, an interval may be determined by the file system 208 to insert the check values into a data object. The check values may be inserted after data segments of a predetermined size of data or may be dynamically allocated as determined by the file system. For example, the check values may be inserted after each data segment starting from the beginning of the data object. Also, a check value can be added to the end of the data object, irrespective of the number of bytes in the last data segment. This can allow a system to verify a variable length data transfer. The check values may be determined based on a calculated error correction value of the data object, such as a CRC or hash value. Further, the check values may be treated as part of the data object when handled by the data storage device software system 204.

When a data object is received from a data storage device, the file system 208 may validate the data object using the check values. If the data object is validated, the file system 208 can remove the check values from the data object and provide the data object to the application module 206 for use. If the data object is not validated, the file system 208 may attempt to retrieve the data object from the data storage device again or may perform data recovery techniques on the invalid data object.

The file system 208 may be executed on a host computer, such as host computer 100 and may perform the methods and functions described herein. Also, the object based data storage device may include another file system to execute the method and functions described herein. In a particular embodiment, the object based data storage device may include a file system comprising software and/or hardware to achieve the integrity checking described herein.

Figure 3:
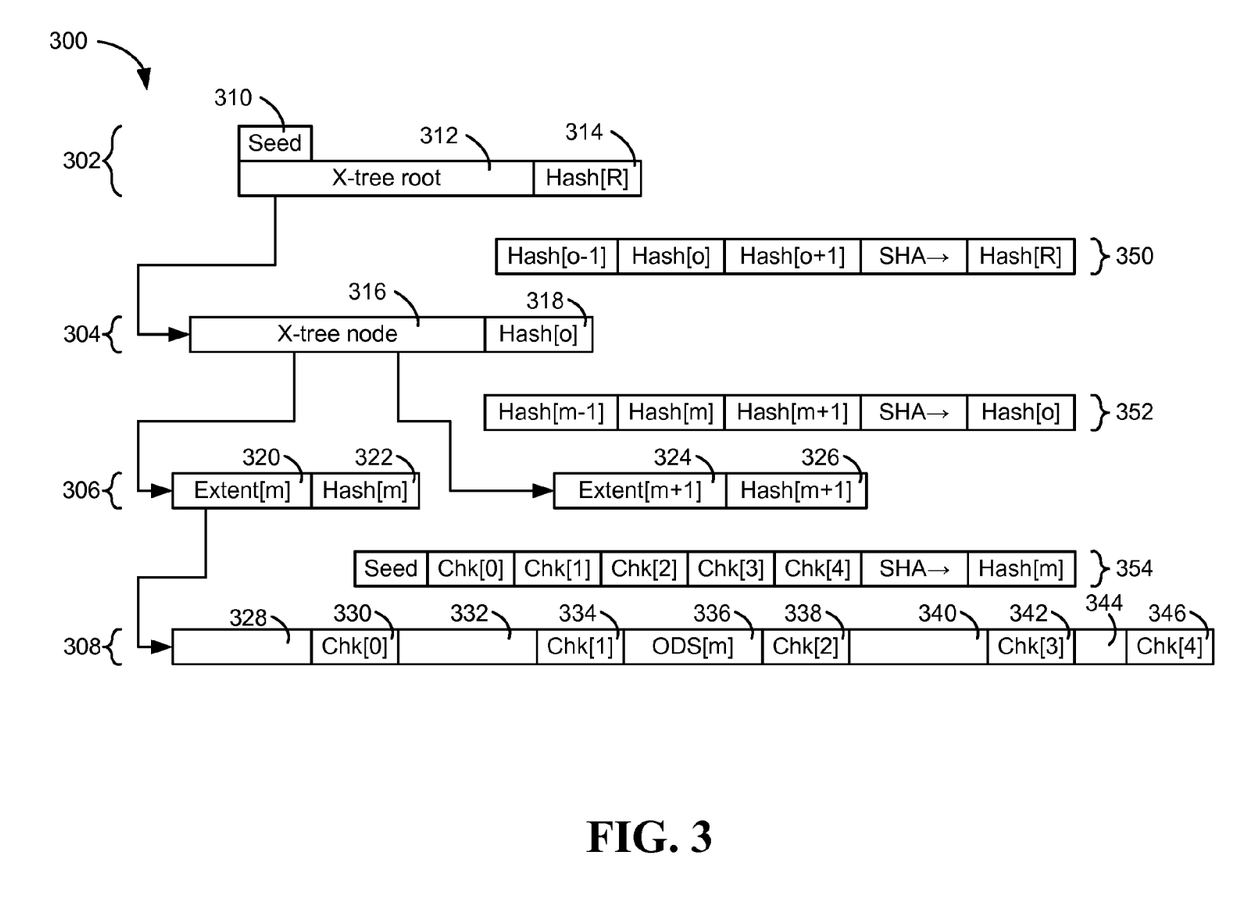
FIG. 3 is a diagram of an illustrative embodiment of file system pointers and check values that can be used with a buffer transfer check system.

Referring to FIG. 3, a diagram of an illustrative embodiment of file system pointers and check values that can be used with a buffer transfer check system are depicted and generally designated 300. The system 300 may be implemented by the file system 208 shown in FIG. 2 or the processor 136 shown in FIG. 1.

The system 300 may include a first level pointer 302, such as an x-tree root 312 that provides a mechanism to tie parts of a file, or data object, together. The first level pointer 302 may also include a hash value 314. The x-tree root 312 may include pointers to a second level pointer 304, such as an x-tree node 316. The second level pointer may also include a hash value 318. The x-tree node 316 may include pointers to third level pointer 306, such as extents 320 and 324. Extents 320 and 324 may be associated with hash value 322 and hash value 326, respectively.

Extent 320 may include a pointer to a data object 308. The data object 308 may include data segments 328, 332, 336, 340, and 344. The data object 308 may also include check values 330, 334, 338, 342, and 346 that allow a system to determine an integrity of the data object 308.

An error in a particular level of pointer may be determined by comparing the hash values of the previous level to the hash value stored at the present level. For example, as shown in hash comparison 354, an error in the check values of the data object 308 may be determined by combining the check values of the data object 308 and comparing that to the hash value 322 of the previous level. In a particular embodiment, the check values of the data object 308 may have to be combined with a known seed value to compare to the hash value 322. For example, the check values may have been seeded with an attribute of the data object, such as object creation time.

Further, as shown in hash comparison 352, an error in the hash values of the third level pointers 306 may be determined by combining the hash values of the third level pointers 306 and comparing that to the hash value 318 of the previous level. Even further, as shown in hash comparison 350, an error in the hash values of the second level pointers 304 may be determined by combining the hash values of the second level pointers 304 and comparing that to the hash value 314 of the previous level. Thus, providing multiple levels of integrity checking can allow a system to quickly check the integrity of a data object as previous levels of pointers can be checked to see if there are any errors at the lower levels.

Figure 4:
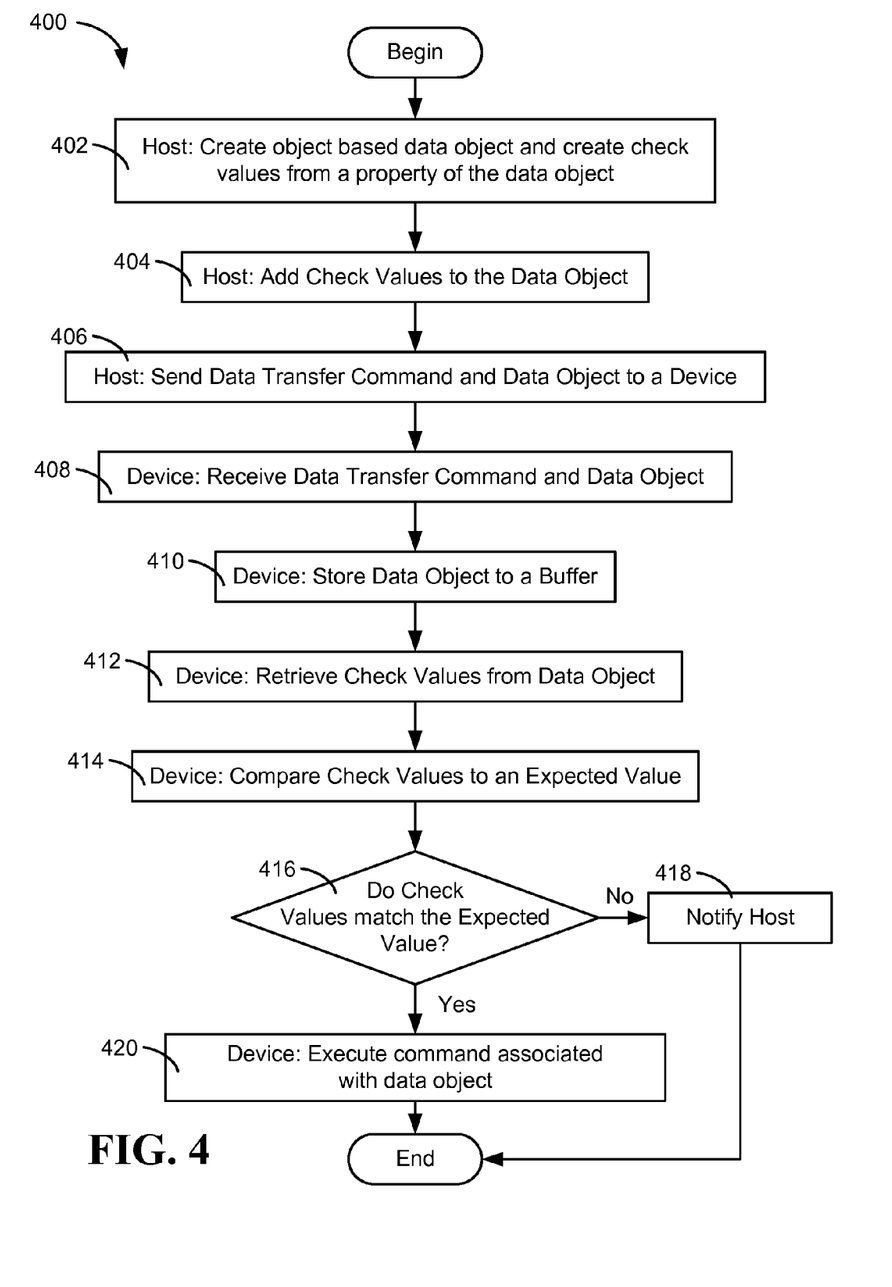
FIG. 4 is a flow chart of a method of operation of functional operations of a buffer transfer check system.

Referring to FIG. 4, a flow chart of an embodiment of a method of operation of a buffer transfer check system is depicted and generally designated 400. The method 400 includes a host, such as host 100 shown in FIG. 1, creating an object based storage data object, at 402. The host may also create check values from a property of the data object, such as a unique data object identifier or a data object creation timestamp. The check values may then be added to the data object with at least one of the check values being added to an end of the data object, at 404. Once the check values are added to the data object, the data object may be sent to a data storage device along with a data transfer command, such as a write command, at 406. The check values can be considered as part of the data object when handled by the storage device, such as for space allocation and storage.

In a particular embodiment, the host may calculate the check values based on an algorithm such as a CRC algorithm or a checksum algorithm. A first check value may be initialized with an object related value known by the host and the data storage device. Each successive check value may be uniquely modified by an incrementing count or logical offset or other deterministic value. In a particular embodiment, the host may also calculate a hash value from the check values to provide a unique signature of the data object. The hash value may be stored in the metadata of the data object prior to transmission.

When the storage device receives the data transfer command and the data object, at 408, the storage device may store the data object to a buffer, at 410. The command may be stored to a command queue for later processing by the storage device. The check values can be considered as part of the data object when handled by the storage device, such as for processing, space allocation, and storage. For example, if the data object is compressed or encrypted, the check values can be compressed or encrypted as part of the data object.

The storage device may retrieve the check values from the data object, at 412, and compare the check values to an expected value, at 414. The expected value(s) may be determined by recalculating the check values or by retrieving the expected value(s) from the metadata of the data object. The method 400 may then include determining if the retrieved check values match the expected value(s), at 416. If the values do not match, the storage device may notify the host, at 418. The host may then re-send the data, perform data recovery techniques, or perform other data integrity operations.

If the retrieved check values match the expected value(s), the storage device may execute the command associated with the data object, at 420. For example, if the associated command is a write command, the storage device may store the data object, including the check values, to a non-volatile data storage medium. In another embodiment, the data storage device may remove the check values prior to saving the data object.

Figure 5:
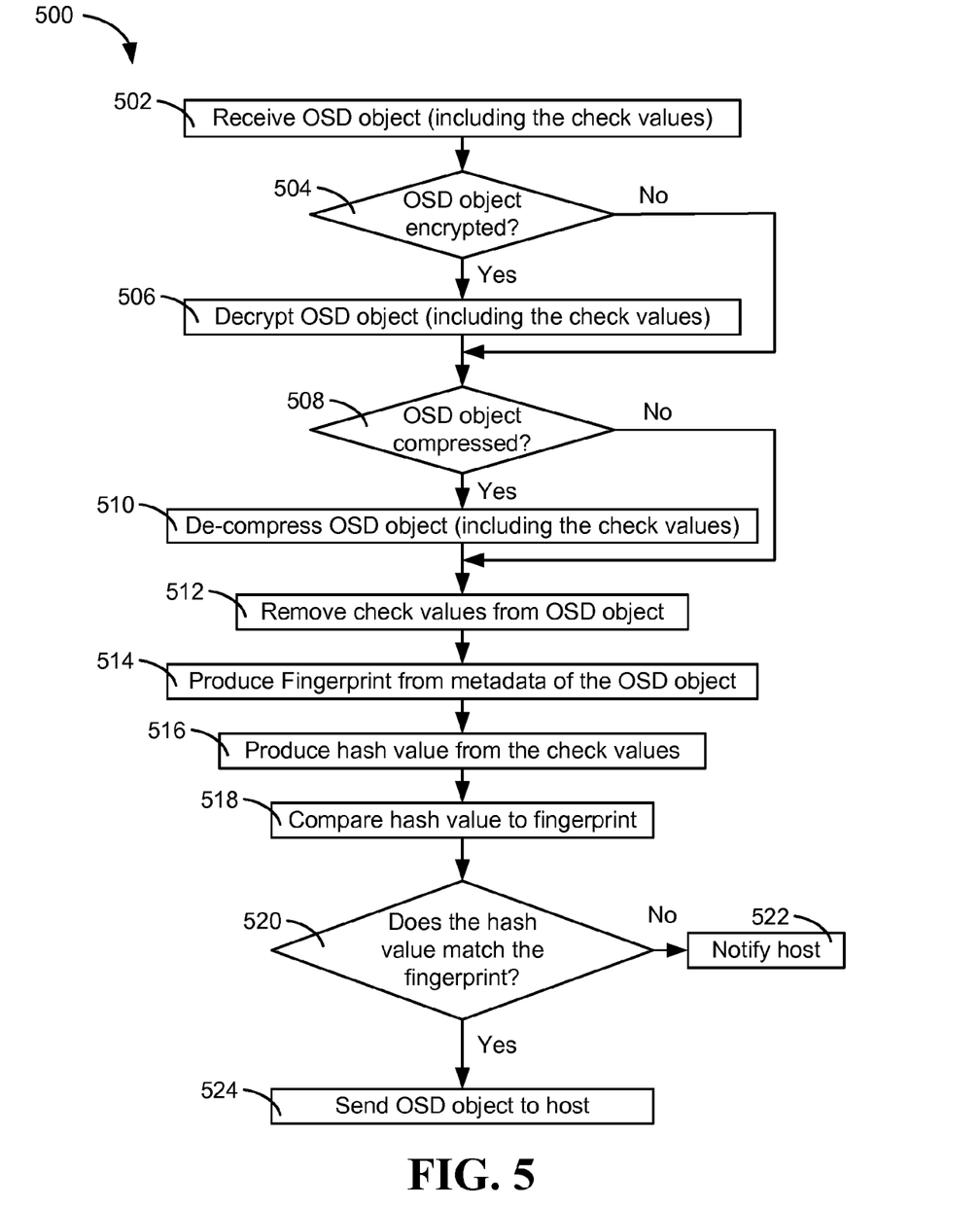
FIG. 5 is a flow chart of a method of operation of functional operations of a buffer transfer check system.

Referring to FIG. 5, a flow chart of an embodiment of a method of operation of a buffer transfer check system is depicted and generally designated 500. The method 500 may be performed by a data storage device or other peripheral that operates to send data to a host processing system. The data storage device may be an object based data storage device.

The data storage device can retrieve a data object from a memory, at 502, and determine if the data object is encrypted, at 504. If the data object is encrypted, the data storage device may decrypt the data object, at 506. The data storage device may then determine if the data object is compressed, at 508, and de-compress the data object if necessary, at 510.

The check values may then be retrieved from the data object, at 512, and a unique signature of the data object may be retrieved from the metadata of the data object, at 514. The unique signature of the data object may be referred to as a fingerprint of the data object. For example, the fingerprint of a data object may comprise a hash value(s) calculated from the check values prior to storing the data object to a data storage medium.

Once the check values have been retrieved from the data object, the storage device may re-calculate the hash value(s) of the data object based on the retrieved check values, at 516. The storage device may then compare the re-calculated hash value(s) to the fingerprint, at 518, and determine if they match, at 520. If they do not match, the storage device may notify the host, at 522, attempt to re-read the data object from the data storage medium, or perform data recovery techniques on the data object.

If the re-calculated hash value(s) match the fingerprint, the storage device may transmit the data object to the host. The storage device may remove the check values prior to transmission to the host or may leave the check values in the data object to allow the host to perform an integrity check once the data object is received.

In accordance with various embodiments, the methods described herein may be implemented as one or more software programs running on a computer processor or controller, such as the processor 102, the memory controller 116, or the processor 136. Dedicated hardware implementations including, but not limited to, application specific integrated circuits, programmable gate arrays, and other hardware devices can likewise be constructed to implement the methods described herein. The systems and methods described herein can be applied to any type of data storage system and could also be applied to any type of peripheral device that has processing capabilities.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A device comprising:
    a processor;
    a file system, executable by the processor, adapted to:
        assign a first pointer to a first data object and a second pointer to a second data object, the first pointer having an associated first hash value and the second pointer having an associated second hash value; and
        assign a third pointer to the first pointer and the second pointer, the third pointer having an associated third hash value that is based on the first and second hash values;
        determine a validity of the first data object and the second data object by:
            calculating a fourth hash value based on the first hash value and the second hash value; and
            comparing the fourth hash value to the third hash value to determine the validity of the first data object and the second data object.

2. The device of claim 1, wherein the processor is within an object based data storage device that comprises an interface configured to receive the first data object and the second data object from a host.

3. The device of claim 1, wherein the processor is further configured to transfer the first data object and the second data object to the host, via the interface, when the first data object and the second data object are determined to be valid.

4. A device comprising:
    a processor;
    a hierarchical file system, executable by the processor, configured to:
        store a data object, having a plurality of data segments with corresponding data transfer check values, at a first level in the hierarchy; and
        store at least one hash value that is calculated from the data transfer check values at a second level in the hierarchy.

5. The device of claim 4, wherein the first level is a lower level in the hierarchy than the second level.

6. The device of claim 5, wherein the file system is further configured to store at least one hash value, which is related to the at least one hash value stored at the second level in the hierarchy, at a third level in the hierarchy.

7. The device of claim 6, wherein the file system is further configured to store at least one hash value, which is related to the at least one hash value at a third level in the hierarchy, at a fourth level in the hierarchy.

8. The device of claim 4, wherein the plurality of data segments comprises a last data segment that has a different number of bytes than the other ones of the plurality of data segments.

9. The device of claim 8, wherein each of the plurality of data segments other than the last data segment has a specific number of bytes and wherein the last data segment has less than the specific number of bytes.

10. The device of claim 8, wherein the file system is further configured to link the first level, the second level, the third level and the fourth level by a plurality of pointers.

11. The device of claim 8, wherein the processor is further configured to:
    combine individual ones of the data transfer check values; and
    compare the combined data transfer check values to the at least on hash value stored at the second level in the hierarchy to determine validity of the data object.

12. The device of claim 8, wherein the processor is further configured to:
    combine individual ones of the plurality of check values and a seed value; and compare the combined check values and the seed value to the at least on hash value stored at the second level in the hierarchy to determine validity of the data object.

13. The device of claim 12, wherein the seed value is a creation time of the object.

14. The device of claim 11, wherein the processor is within an object based data storage device that comprises an interface configured to receive the first data object from a host.

15. The device of claim 14, wherein the processor is further configured to transfer the data object to the host, via the interface, when the data object is determined to be valid.

16. A method comprising:
storing a data object, having a plurality of data segments with corresponding data transfer check values, at a first level in a hierarchical file system in a memory; and
storing at least on hash value that is related to the data transfer check values at a second level in the hierarchical file system;
combining individual ones of the plurality of check values and a seed value; and
comparing the combined check values and the seed value to the at least one hash value stored at the second level in the hierarchy to determine validity of the data object.

17. The method of claim 16, further comprising storing at least one hash value, which is related to the at least one hash value stored at the second level in the hierarchy, at a third level in the hierarchy.

18. The method of claim 17, further comprising storing at least one hash value, which is related to the at least one hash value at a third level in the hierarchy, at a fourth level in the hierarchy.

19. The method of claim 16, wherein the plurality of data segments comprises a last data segment that has a different number of bytes than the other ones of the plurality of data segments.

20. The method of claim 19, wherein each of the plurality of data segments other than the last data segment has a specific number of bytes and wherein the last data segment has less than the specific number of bytes.

21. The device of claim 18, further comprising linking the first level, the second level, the third level and the fourth level by a plurality of pointers.

\* \* \* \* \*

UNITED STATES PATENT AND TRADEMARK OFFICE
CERTIFICATE OF CORRECTION

| | | |
|---|---|---|
| PATENT NO. | : 8,601,358 B2 | Page 1 of 1 |
| APPLICATION NO. | : 12/617284 | |
| DATED | : December 3, 2013 | |
| INVENTOR(S) | : Charles W. Thiesfled and Sami Iren | |

It is certified that error appears in the above-identified patent and that said Letters Patent is hereby corrected as shown below:

In the Claims

Column 9:

Line 14 (4th line of claim 16), delete "and"

Signed and Sealed this
Fifteenth Day of April, 2014

Michelle K. Lee
*Deputy Director of the United States Patent and Trademark Office*